(12) United States Patent
Slesazeck

(10) Patent No.: US 7,719,869 B2
(45) Date of Patent: May 18, 2010

(54) MEMORY CELL ARRAY COMPRISING FLOATING BODY MEMORY CELLS

(75) Inventor: Stefan Slesazeck, Dresden (DE)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 11/942,330

(22) Filed: Nov. 19, 2007

(65) Prior Publication Data

US 2009/0129145 A1 May 21, 2009

(51) Int. Cl.
*G11C 5/06* (2006.01)
(52) U.S. Cl. ............... 365/63; 365/174; 365/185.05; 365/185.12
(58) Field of Classification Search ............ 365/63, 365/174, 185.05, 185.12
See application file for complete search history.

(56) References Cited

U.S. PATENT DOCUMENTS

| | | | | |
|---|---|---|---|---|
| 5,874,760 | A * | 2/1999 | Burns et al. ............... 257/315 |
| 6,066,869 | A * | 5/2000 | Noble et al. ............... 257/296 |
| 6,548,848 | B2 * | 4/2003 | Horiguchi et al. ......... 257/296 |
| 6,913,964 | B2 * | 7/2005 | Hsu ............................. 438/239 |
| 6,917,078 | B2 * | 7/2005 | Bhattacharyya ............. 257/347 |
| 7,120,046 | B1 * | 10/2006 | Forbes ......................... 365/149 |
| 7,149,109 | B2 | 12/2006 | Forbes |
| 7,158,410 | B2 * | 1/2007 | Bhattacharyya et al. ..................... 365/185.08 |
| 7,183,164 | B2 * | 2/2007 | Haller ......................... 438/270 |
| 7,209,384 | B1 * | 4/2007 | Kim ............................. 365/175 |
| 7,514,321 | B2 * | 4/2009 | Mokhlesi et al. ............ 438/259 |
| 2002/0130341 | A1 | 9/2002 | Horiguchi et al. |
| 2005/0190617 | A1 | 9/2005 | Forbes et al. |
| 2005/0254279 | A1 | 11/2005 | Schwerin |
| 2006/0249770 | A1 | 11/2006 | Huo et al. |

FOREIGN PATENT DOCUMENTS

WO    2007138517 A1    12/2007

* cited by examiner

*Primary Examiner*—Viet Q Nguyen
(74) *Attorney, Agent, or Firm*—Edell, Shapiro & Finnan, LLC

(57) ABSTRACT

A memory cell array includes a plurality of floating body memory cells, which are arranged in cell rows, and world lines, wherein each word line is configured to control memory cells associated with a pair of cell rows. The memory cell array also includes bitlines, wherein each bitline is electrically connected to an individual memory cell of each pair of the cell rows.

18 Claims, 9 Drawing Sheets

MEMORY CELL ARRAY COMPRISING FLOATING BODY MEMORY CELLS

BACKGROUND

Single-transistor floating body memory cells base upon charge storage effects in an insulated floating semiconductor body. The floating body is sandwiched between two source/drain regions, wherein the first source/drain region may be connected to a source line or a common source plate and a second source/drain region may be connected to a bit line. A gate electrode is configured to switch a current between the two source/drain regions by a select voltage applied to the gate electrode. By applying a suitable write signal to the gate electrode or to the gate electrode and the source line/common source plate, charge may be injected in or removed from the floating body in accordance to a voltage supplied to the bit line. By applying a suitable read signal to the gate electrode or to the gate electrode and the source line/common source plate, an output signal may be caused in the bit line, wherein the output signal depends on the amount and/or type of charge stored in the floating body region. Typically, the read signal differs from the write signal, for example with regard to the voltage amplitude.

A need exists for integrated circuits comprising a high density floating body memory cell array and simple peripheral circuitry for addressing the memory cells of a floating body memory cell array.

SUMMARY

Described herein is an integrated circuit including a memory cell array and a method of operating the same. The memory cell array comprises a plurality of floating body memory cells arranged in cell rows. The memory cell array further comprises world lines, wherein each word line can control the memory cells associated with a pair of cell rows. The memory cell array further comprises bitlines, wherein each bitline is electrically connected to a single one of the memory cells of each pair of the cell rows.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

Features and advantages of embodiments of the memory cell array and method will be apparent from the following description of the drawings. The drawings are not necessarily to scale. Emphasis is placed upon illustrating the principles.

DETAILED DESCRIPTION

Described herein is an integrated circuit including a memory cell array and a method of operating the same. In the following paragraphs, embodiments of the device and method are described in connection with the figures.

Figure 1A:
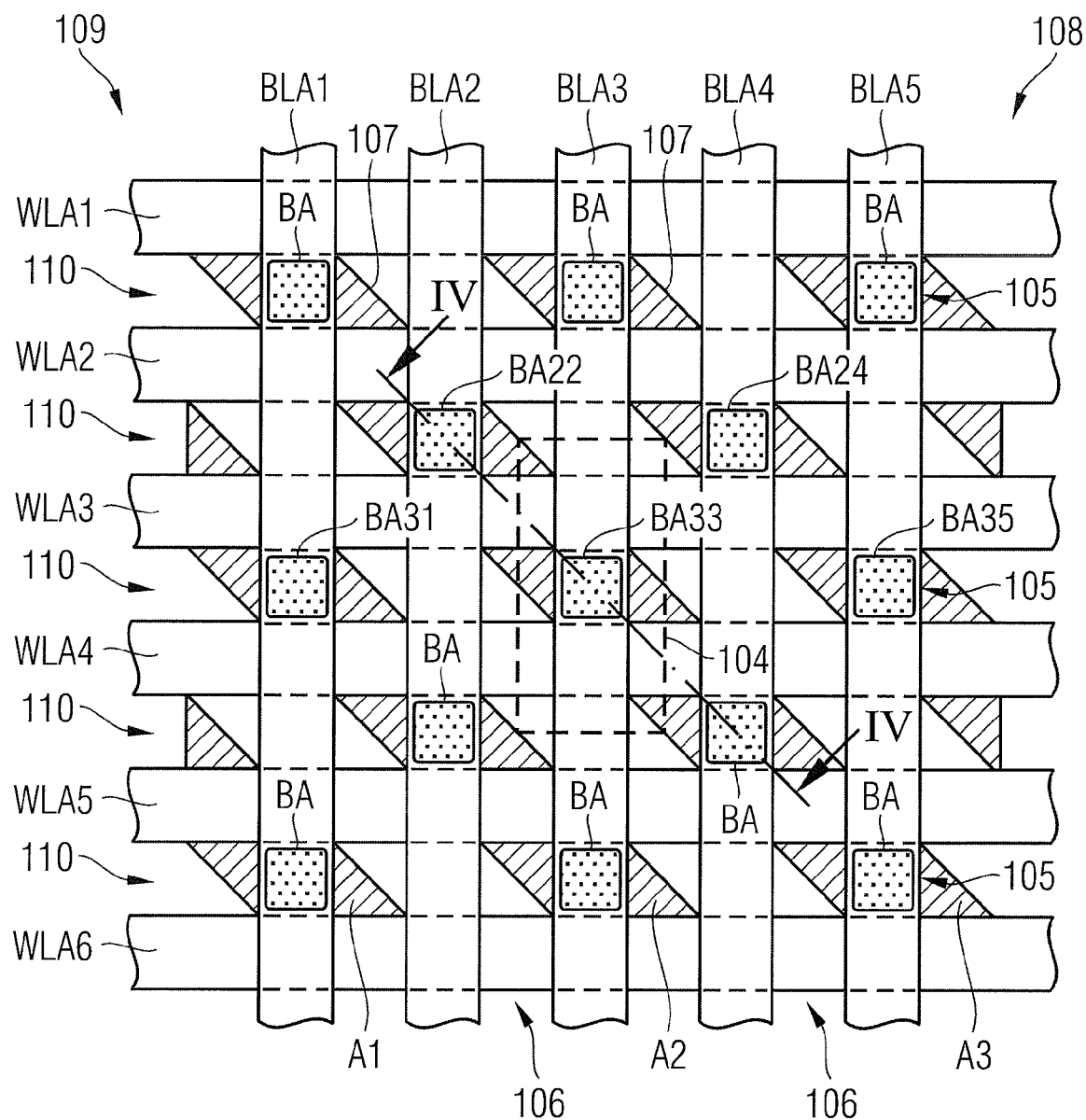
FIG. 1A is a schematic top view of a portion of a memory cell array comprising segmented tilted active area lines according to an embodiment.
Figure 1A:
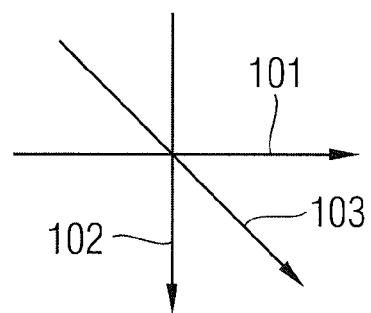

FIG. 1A shows a portion of a memory cell array 108 of an integrated circuit 109. The memory cell array 108 comprises a plurality of memory cells 105 that are arranged in cell rows 110 extending along a first direction 101. Each memory cell 105 comprises a floating semiconductor body (floating body in the following) and is capable of storing charge in the floating body. The memory cell array 108 further comprises a plurality of wordlines WLA1, ..., WLA6 extending along the first direction 101 and a plurality of bit lines BLA1, ..., BLA5 extending along a second direction 102 which intersects the first direction 101. The second direction 102 may be perpendicular to the first direction 101. Each word line WLA1, ..., WLA6 may be arranged in a word line trench formed in a semiconductor substrate from a main surface between a pair of neighboring cell rows 110. One single word line WLA1, ..., WLA6 may be arranged between each pair of neighboring cell rows as illustrated. In accordance with other embodiments, one single word line WLA1, ..., WLA6 may be arranged between each odd pair of neighboring cell rows and a row insulator structure made of dielectric materials, for example a silicon oxide or silicon dioxide, may be disposed between each even pair of neighboring cell rows such that the row insulator structures and the word lines are provided in alternating order along the second direction. According to an embodiment, the word lines WLA1, ..., WLA6 are completely buried in the region of the memory cell array 108. Further, each word line WLA1, ..., WLA6 is capable of controlling those memory cells 105 which are assigned to one single pair of neighboring cell rows 110. Via each word line WLA1, ..., WLA6, the memory cells 105 assigned to one single pair of neighboring cell rows 110 are addressable and/or controllable. Each bit line BLA1, ..., BLA5 is electrically connected to one single memory cell 105 of each pair of neighboring cell rows 110 via contact regions BA. Each of those memory cells 105, which are controlled by the same word line, for example the third word line WLA3, is connected to another bit line BLA1, ..., BLA5. The memory cell array 108 may further comprise memory cells, word lines and bit lines not illustrated in FIG. 1A.

In accordance with the memory cell array 108, word lines WLA1, . . . , WLA6 and cell rows 110 alternate along the second direction 102. Each word line WLA1, . . . , WLA6 adjoins to the memory cells 105 of two neighboring cell rows 110. Applying a write signal, for example, to the third word line WLA3 selects the memory cells 105 of that two cell rows 110, which adjoin the third word line WLA3, for example, those memory cells associated with the contact regions BA22, BA24, BA31, BA33, BA35. Each of the memory cells 105 associated to the third word line WLA3 adjoins in addition to either the second or the fourth word line WLA2, WLA4. The second and third word lines WLA2, WLA3 may be used to control the memory cells 105 arranged in between them.

In accordance with an embodiment, the integrated circuit 109 comprises a first word line driver circuit that may be configured to supply either a write voltage or a deselect voltage (i.e., hold voltage) to a first group of word lines, for example to the odd word lines WLA1, WLA3, WLA5, and a second word line driver circuit that may be configured to supply either a read voltage or a deselect voltage to a second group of word lines, for example the even word lines WLA2, WLA4, WLA6. The word lines of the first and second group are arranged in alternating order. Both the first and the second word line driver circuits may be realized by simple CMOS inverter structures, wherein a first voltage, from which a write voltage may be derived, may be supplied to the first word line driver circuit and a second voltage, from which the read voltage may be derived, may be supplied to the second word line driver circuit. Each word line driver circuit may switch between two voltage levels only.

In accordance with another embodiment, the integrated circuit 109 comprises a multiple voltage word line driver circuit configured to supply a write signal, a read signal and a deselect signal to a first group of word lines, for example, the odd word lines WLA1, WLA3, WLA5, and a back gate driver circuit. The write and the read signals may be voltage square pulses or a sequence of square pulses of different amplitude or dual level or multilevel pulses with two or more contiguous phases of different amplitude, by way of example. The back gate driver circuit is connected to each word line of a second group of word lines, for example, the even word lines WLA2, WLA4, WLA6 and supplies a back gate voltage to the second group of word lines, wherein the word lines of the first and second group are arranged in alternating order. The back gate driver circuit may be comparable simple, as the back gate voltage may be supplied to the memory cells 105 contemporaneously and without selection circuits.

According to the embodiment as illustrated in FIG. 1A, the memory cells 105 may result from tilted active area lines A1, A2, A3 which run along a third direction 103 that is tilted towards both the first 101 and the second 102 direction, wherein the memory cells 105 are arranged in cell columns extending along the third direction. Between each pair of neighboring tilted active area lines A1, A2, A3, a line-shaped buried insulator structure 106 may be disposed. An angle between the first direction 101 and the third direction 103 may be about 25 degrees to about 65 degrees (e.g., about 40 degrees to about 50 degrees (e.g., 45 degrees)). The tilted active area lines A1, A2, A3 may be straight lines or zigzag lines with portions angled (e.g., symmetrically) towards the third direction 103. The word lines WLA1, . . . , WLA6 partition or segment the active area lines A1, A2, A3, such that segmented active areas 107 are formed. In each segmented active area 107, one memory cell 105 as described in detail with reference to FIG. 4A may be formed. In a planar cross-section, the segmented active areas 107 may be essentially rhombic. The memory cells 105 may be arranged in a checkerboard layout, wherein each word line WLA1, . . . , WLA6 passes associated memory cells 105 on two opposing sides of the word line in alternating fashion, and in an open or folded bit line configuration with a reference bit line outside or within the respective portion of the memory cell array 108.

The memory cell array 108 as depicted in FIG. 1A may have the shape of a rectangle and both the word line driver circuit and a sense amplifier circuit connected to the bit lines BLA1, . . . , BLA5 may be arranged along opposing sides of the rectangle, respectively.

Figure 1B:
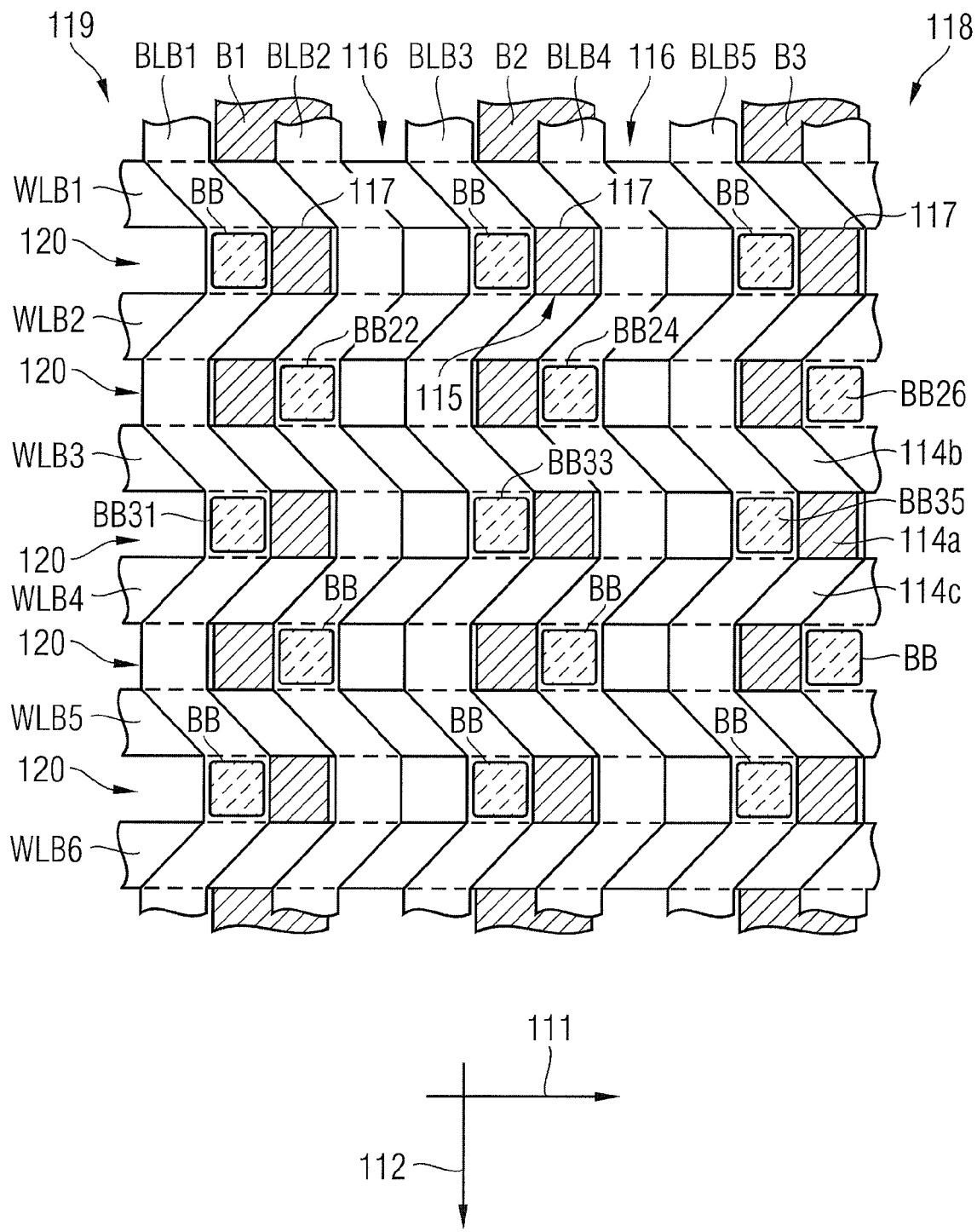
FIG. 1B is a schematic top view of a portion of a memory cell array comprising meandering bit lines according to a further embodiment.

FIG. 1B refers to another layout for word lines WLB1, . . . , WLB6, bitlines BLB1, . . . , BLB5 and active area lines B1, B2, B3. The active area lines B1, B2, B3 are formed in a semiconductor substrate and run along a second direction 112. Buried insulator structures 116 are disposed between neighboring active area lines B1, B2, B3. The word lines WLB1, . . . , WLB6 run along a first direction 111 that intersects the second direction 112, for example, perpendicularly as illustrated in FIG. 1B. The word lines WLB1, . . . , WLB6 segment or partition the active area lines B1, B2, B3 and the insulator structures 116, wherein segmented active areas 117 are formed. Each individual one of the segmented active areas 117 is arranged between two neighboring word lines WLB1, . . . , WLB6 and two opposing segments of the insulator structures 116. In each individual one of the segmented active areas 117 a memory cell 115 is formed. Each memory cell 115 is connected via a contact region BB to one of the bit lines BLB1, . . . , BLB5. The bit lines BLB1, BLB5 run essentially along the second direction 112. Each active area line B1, B2, B3 is associated to two of the bit lines BLB1, . . . , BLB5. The two bit lines associated to the same active area line B1, B2, B3 meander along the second direction 112, such that they contact the segmented active areas 117 resulting from the same active area line in alternating order.

In accordance with an embodiment, each bit line BLB1, . . . , BLB5 comprises straight portions 114a extending along the second direction and first and second oblique portions 114b, 114c extending tilted to the second direction 112, wherein the angles of the first oblique portions 114b and the second oblique portions 114c are symmetrical with respect to the second direction 112. In accordance to yet another embodiment, the active area lines B1, B2, B3 may be significantly wider, for example, by a factor of three, than the buried insulator structures 116, such that the contact regions BB may be arranged along straight bit lines BLB1, . . . , BLB5.

Each bit line BLB1, . . . , BLB5 is electrically connected to a single one of the memory cells 115 of each pair of cell rows 120. Each word line WLB1, . . . , WLB6 is associated to the memory cells 115 of two neighboring cell rows 120. For example, the third word line WLB3 is associated to the memory cells 115 being in electrical contact to the bitlines BLB1, . . . , BLB5 via the contact regions BB31, BB22, BB33, BB24, BB35, BB26. Each of the memory cells 115 associated to the third word line WLB3 is also associated to either the second word line WLB2 or the fourth word line WLB4. Each word line WLB1, . . . , WLB6, to which a memory cell 115 is associated, may be used to write data or to read data from the respective memory cell 115.

In accordance with other embodiments, both the bit lines BLB1 . . . BLB5 and the active area lines B1, B2, B3 may comprise oblique and straight portions, wherein each bit line BLB1, . . . , BLB5 is associated to one of the active area lines B1, B2, B3 in a twisted or "wiggled" manner. Each bit line BLB1, . . . , BLB5 contacts each second one of the segmented active areas 117 resulting from the same active area line.

Figure 1C:
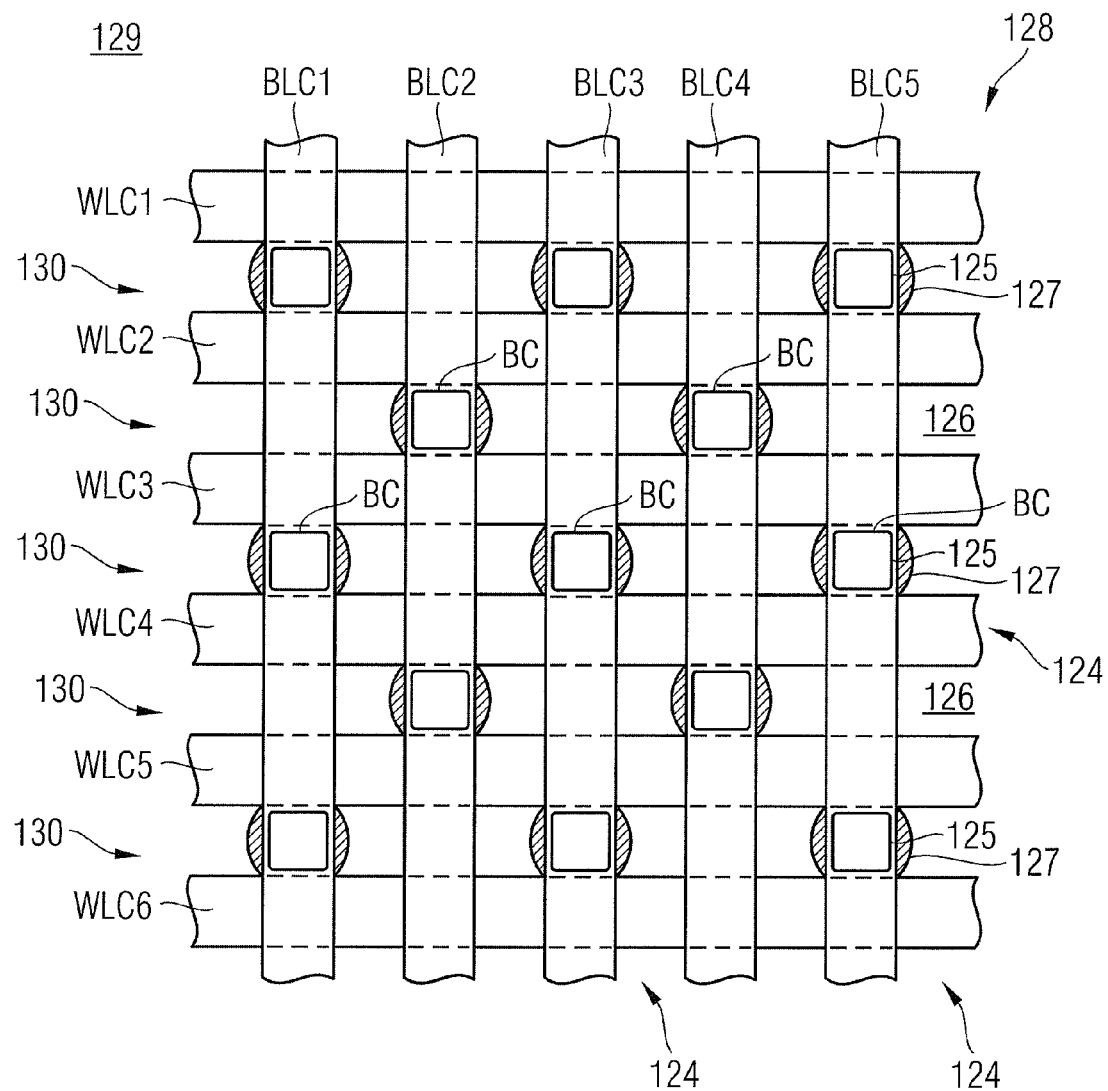
FIG. 1C is a schematic top view of a portion of a memory cell array comprising active area dots or pre-segmented active area lines according to another embodiment.
Figure 1C:
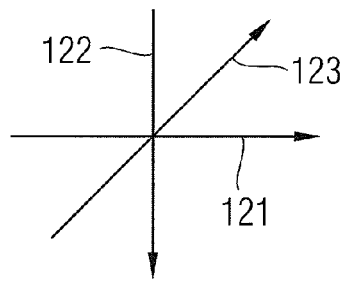

A memory cell array 128 of an integrated circuit 129 as illustrated in FIG. 1C comprises word lines WLC1, ..., WLC6 running along a first direction 121 and bit lines BLC1, ..., BLC5 running along a second direction 122 that intersects the first direction 121, for example perpendicularly. Active areas 127 are arranged along a third direction 123 that is oblique to both the first and the second directions 121, 122. The active areas 127 are embedded in a buried insulator structure 126, insulating the active areas 127 from each other. The active areas 127 may be formed, for example, as dots via a dot or hole mask or they may result from active area lines extending along the first direction 121 that have previously been segmented by another dot mask or an oblique stripe mask. Each active area 127 is formed between two neighboring word lines WLC1, ..., WLC6 and beneath one of the bit lines BLC1, ..., BLC5. In each active area 127 a memory cell 125 is formed which is connected to the associated bit line BLC1, ..., BLC5 via a contact region BC. Along the first direction 121 the memory cells 125 are arranged in cell rows 130, wherein one single cell row 130 is arranged between two neighboring word lines WLC1, ..., WLC6 and one single word line WLC1, ..., WLC6 is formed between a pair of neighboring cell rows 130, respectively. Along the third direction 123 the memory cells 125 are arranged in cell columns 124.

Figure 2:
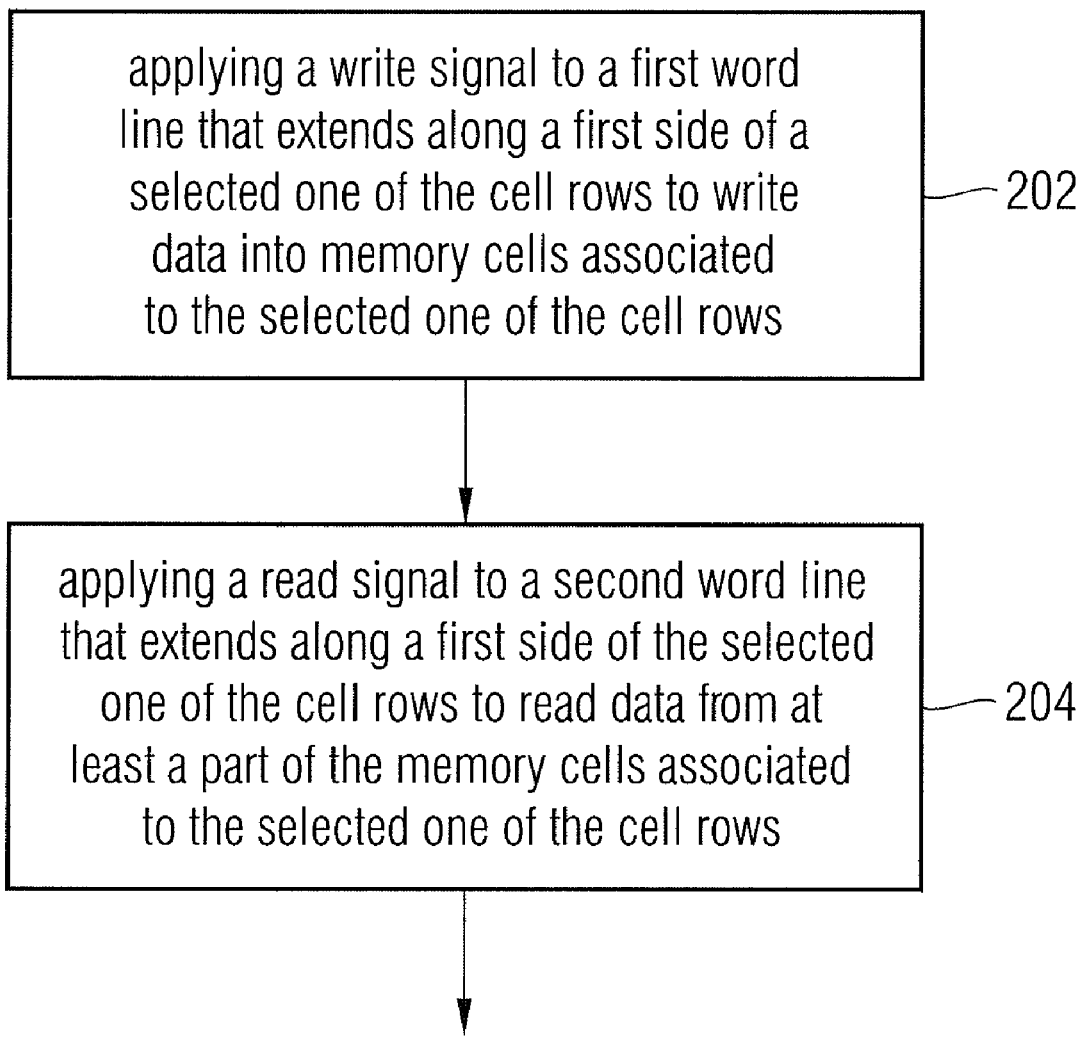
FIG. 2 is a simplified flow-chart illustrating a method of operating an integrated circuit in accordance with a further embodiment.

FIG. 2 is a flowchart illustrating a method of operating an integrated circuit comprising a memory cell array with floating body memory cells arranged in cell rows. According to the method, data is written into memory cells associated to a selected one of the cell rows by applying a write signal to a first word line that extends along a first side of the selected one of the cell rows (202). Data is read out from at least a part of the memory cells associated to the selected one of the cell rows by applying a read signal to a second word line that extends along a second side of the selected one of the cell rows. As each of the cell rows is associated to two neighboring word lines, the read operations may use other word lines than the write operation. As typically the read voltage is another voltage than the write voltage, a first group of word lines may be connected to a first word line driver circuit and a second group of word lines may be connected to a second word line driver circuit, wherein each word line driver circuit drives a high and a low voltage for selecting/deselecting the respective word line only. The select voltage levels of the two word line driver circuits differ from each other.

The word lines and the cell rows extend along a first direction and alternate along a second direction that is perpendicular to the first direction. One single word line is disposed between two neighboring cell rows and one single cell row is arranged between two neighboring word lines. The write signal is a first voltage pulse with a write voltage typically greater than a threshold voltage of the field effect transistor and the read signal is a second voltage pulse with a read voltage typically lower than the threshold voltage. Typically, the read voltage differs from the write voltage by at least 10 percent of the write voltage.

In accordance with an embodiment, the read signal is further applied to a third word line associated with the other cell row, the memory cells of which are written by the respective first word line, and all bit lines may be selected to read out the memory cells of two cell rows associated with the third word line.

In accordance with another embodiment, in order to read out all memory cells associated with a word line n, in a first step, a first group of bit lines is selected, wherein the bit lines of the first group are associated with a first cell row between the word line n and a first neighboring word line n+1. The data that is read out from the first cell row may be buffered or latched. In a second step, a second group of bit lines is selected, wherein the bit lines of the second group are associated with a second cell row between the word line n an a second neighboring word line n−1 facing the first neighboring word line n+1 at the word line n. The data that is read out from the second cell row may be combined with the latched data to supply the complete data associated with the word line n.

Figure 3A:
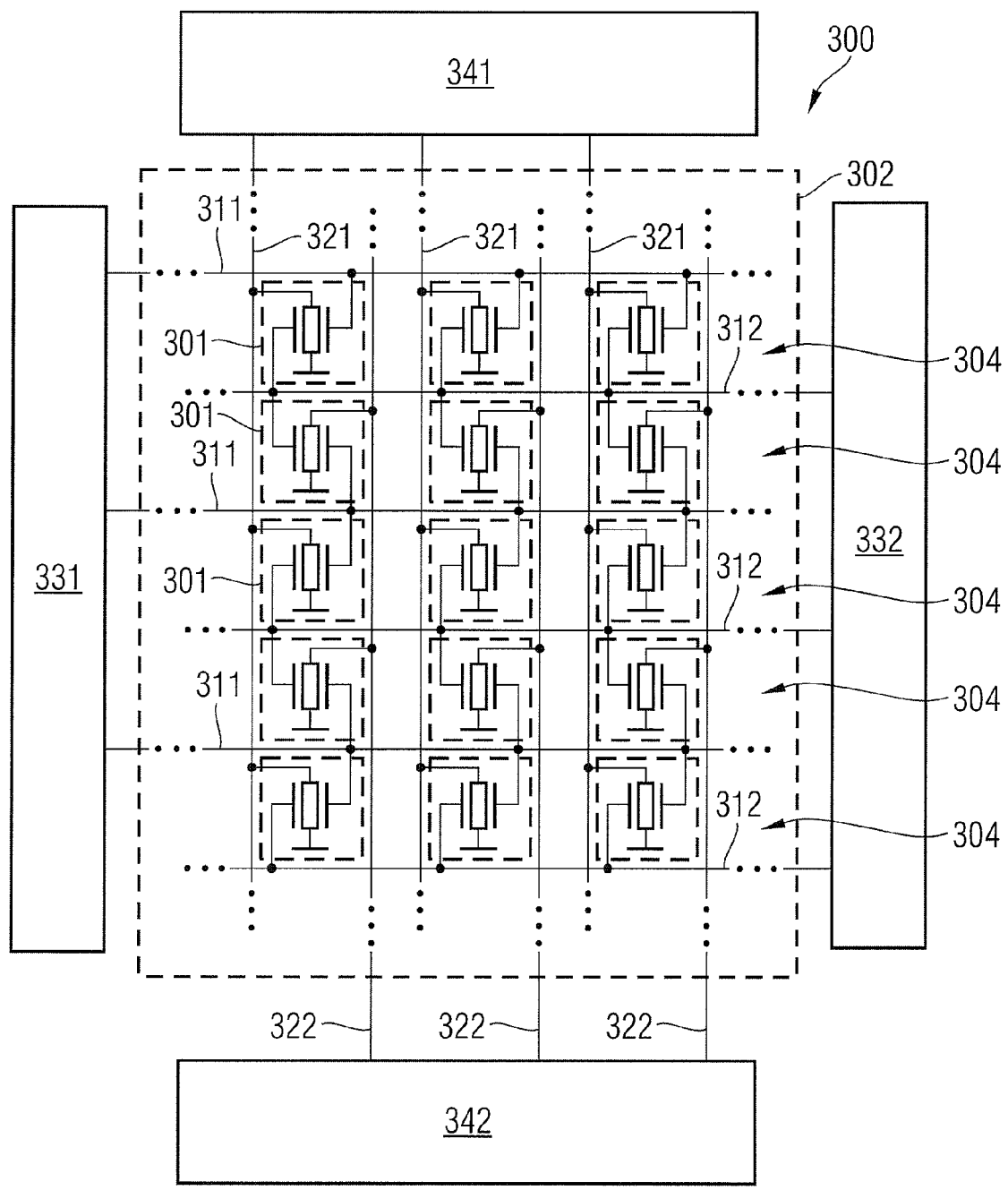
FIG. 3A is a schematic circuit diagram of a portion of an integrated circuit comprising a memory cell array and two groups of wordline drivers in accordance with another embodiment.

FIG. 3A refers to an integrated circuit 300 comprising a memory cell array 302 including a plurality of floating body memory cells 301 that are arranged in cell rows 304. Each floating body memory cell 301 is connected to a first word line 311 of a first group of word lines and a second word line 312 of a second group of word lines. A first word line driver circuit 331 is connected to the first word lines 311 and is configured to selectively control a write operation concerning memory cells 301 associated to a selected one of the first word lines 311. The second word lines 312 are connected to a second word line driver circuit 332 that is configured to selectively control a read operation on memory cells 301 associated with selected ones of the second word lines 312. Each memory cell 301 is further connected to a bit line 321, 322. First bit lines 321 of a first group of bit lines are connected to a first sense amplifier circuit 341 and second bit lines 322 of a second group of bit lines are connected to a second sense amplifier circuit 342. The first and the second sense amplifier circuits 341, 342 may be arranged on opposing sides of the memory cell array 302. The first and second bit lines 321, 322 are arranged in alternating order and the first and second word lines 311, 312 are arranged in alternating order. The first and the second wordline driver circuits 331, 332 may face each other at the memory cell array 302.

Each memory cell 301 may be controlled through both word line driver circuits 331, 332. Therefore, the first word line driver circuit 331 may be configured to supply either a write voltage or a deselect or "hold" voltage to the first word lines 311 and the second word line driver circuit 332 may be configured to supply either a read voltage or the deselect voltage to the word lines 312. Both the first and the second word line driver circuits 331, 332 may be realized by simple CMOS inverter structures, wherein a first voltage, from which the write voltage may be derived, may be supplied to the first word line driver circuit 331 and a second voltage, from which the read voltage may be derived, may be supplied to the second word line driver circuit 332. Each word line driver circuit 331, 332 switches only between the deselect voltage level and the write voltage level or the deselect voltage level and the read voltage level. Simple word line driver circuits 331, 332 may save space on the substrate.

Figure 3B:
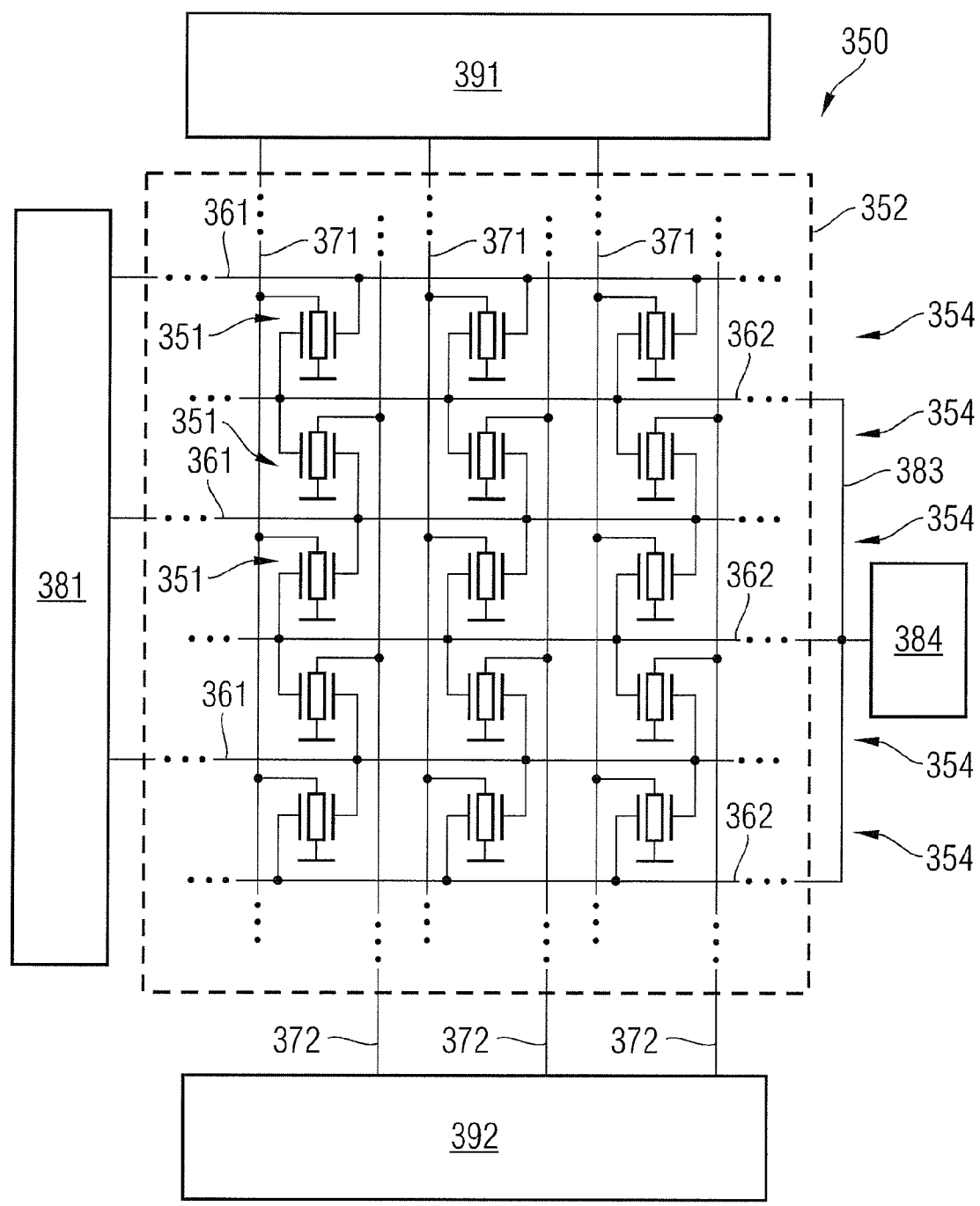
FIG. 3B is a schematic circuit diagram illustrating a portion of an integrated circuit comprising a memory cell array and a back gate voltage source in accordance with another embodiment.

FIG. 3B refers to an integrated circuit 350 including a memory cell array 352 of floating body memory cells 351 arranged in cell rows 354. Each memory cell 351 is connected to one of a plurality of first or one of a plurality of second bitlines 371, 372, wherein first and second bit lines 371, 372 are arranged in alternating fashion. The first bit lines 371 may be connected to a first sense amplifier circuit 391 and the second bit lines 372 may be connected to a second sense amplifier circuit 392. The first and second sense amplifier circuits 391, 392 are configured to sense a current or a voltage caused on the respective bit line 371, 372 through the selected memory cell 351 during a read operation and face each other at the memory cell array 352. In addition, each memory cell 351 is associated to one of a plurality of first word lines 361 and to one of a plurality of second word lines 362, wherein first and second word lines 361, 362 are arranged in alternating order. The first word lines 361 may be connected to a multiple voltage word line driver circuit 381. The multiple voltage word line driver circuit 381 is configured to drive a write signal, when data is written into a memory cell 351, a read signal, when data is read out from a memory cell 351 and a deselect voltage for deselecting those memory cells which are not addressed. The multiple voltage word line driver circuit 381 may be arranged along one side of the memory cell array 352. According to other embodiments, the multiple voltage word line driver circuit 381 may be split up in two portions facing each other at the memory cell array 352.

The integrated circuit 350 further comprises a back gate voltage source 384 that is connected to the second word lines 362 and that supplies a back gate voltage to the second word lines 362. The back gate voltage, which may be a constant voltage, may be supplied to selected and unselected memory cells 351 such that the back gate voltage source 384 may be simple and small in terms of substrate surface in relation to a conventional word line driver circuit.

Figure 4A:
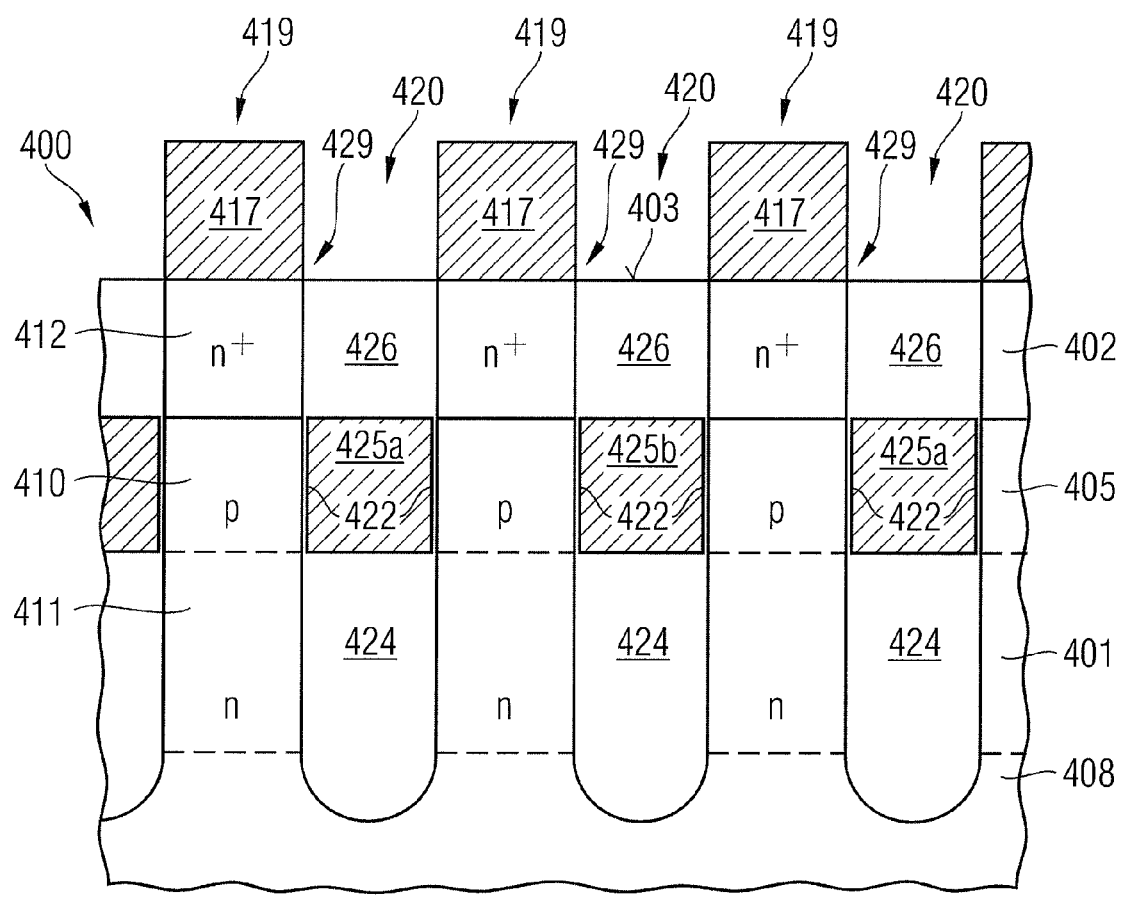
FIG. 4A is a schematic cross-sectional view of a portion of a memory cell array comprising vertical single transistor floating body memory cells in accordance with a further embodiment.

FIG. 4A refers to a cross-sectional view through a substrate 400 comprising vertical floating body memory cells 429 and may correspond to line IV-IV of FIG. 1. The cross-section may run along a segmented active area line A1, A2, A3 as illustrated in FIG. 1A. The substrate 400 may be, by way of example, a preprocessed single crystalline silicon wafer or a silicon-on-insulator wafer and may comprise further doped and undoped portions, epitaxial semiconductor layers supported by a base conductor or a base insulator as well as other semiconductor and insulator structures that have previously been fabricated. An upper portion of the substrate 400 may comprise a floating layer 405 of a first conductivity type sandwiched between an upper layer 402 of a second conductivity type, which is the opposite of the first conductivity type, and a buried layer 401 of the second conductivity type.

According to the example as illustrated in FIG. 4A, the first conductivity type is the p-type and the second conductivity type is the n-type. Word line structures 420 extending in a direction intersecting the cross-sectional plane are disposed between neighboring cell rows 419 of memory cells 429, wherein one single word line structure 420 is arranged between two neighboring cell rows 419 and one single cell row 419 is arranged between two neighboring word line structures 420, respectively. Insulator structures (not shown) are disposed between neighboring memory cells 429 within the cell rows 419 before and behind the cross-sectional plane. The word line structures 420 and the insulator structures have lower edges below an upper edge of the substrate 400 and may have the same depth with respect to a main surface 403 of the substrate 400. An upper edge of the word line structures 420 may be below the main surface 403 such that the word line structures 420 are completely buried. In accordance with another embodiment, the insulator structures may intersect the buried layer 401 to form, from the buried layer 401, source or select lines running along the segmented active area lines A1, A2, A3 of FIG. 1A. According to a further embodiment, the word line structures 420 may intersect the buried layer 401 to form source or select lines running parallel to the word lines structures 420.

The depth of the word line structures 420 may be selected to cut through the floating layer 405, wherein the lower edge of the word line structures 420 is below the lower edge of the floating layer 405 with respect to the main surface 403. The word line structures 420 may also pattern an upper portion of the buried layer 401, wherein the lower edge of the word lines structures 420 is below the upper edge of the buried layer 401 and above the lower edge of the buried layer 401, or may cut through the buried layer 401 to form select lines running along the word line direction, wherein the lower edge of the word lines structures 420 is below the lower edge of the buried layer 401.

The insulator structures and the word line structures 420 define semiconductor pillars between them. In a cross-section parallel to the main surface 403, the cross-shape of the pillars may be a rhomb, as for example, in a layout as shown in FIG. 1A, a square, as for example, in the layout according to FIG. 1B, or a quadrangle with rounded lateral side, as for example, in a layout according to FIG. 1C. From the upper layer 402, second source/drain regions 412 (also referred to as a second electrode) result in an upper portion of each pillar. In the buried layer 401, a first source/drain region 411 (also referred to as a first electrode) is formed in each pillar, wherein the first source/drain regions 411 of at least a group of pillars that are assigned to the same source line are connected to each other via the non-patterned or line-shaped bottom portion of the buried layer 401. In addition, in each pillar, a floating body region 410 is formed from the floating layer 405, wherein the floating body region 410 is sandwiched between the first and second source/drain regions 411, 412 and is without contact to a bulk portion 408 of the substrate 400 below the buried layer 401. The bulk portion 408 may be a further portion of a single, crystalline semiconductor wafer or may comprise an oxide layer, for example a silicon oxide layer insulating the upper portion 400 from further portions of the substrate 400 below the bulk portion 408, which may be a bulk layer.

Each word line structure 420 comprises two gate dielectrics 422 formed at the interfaces between the word line structures 420 and the adjoining memory cells 429. Each gate dielectric 422 extends essentially along the portion of the memory cell 429 comprising the floating body region 410. Each gate dielectric 422 may overlap with the first and/or the second source/drain regions 411, 412 or may be restricted to the floating body region 410 without overlapping the first or second source/drain regions 411, 412. The gate dielectric 422 may be a thermally grown silicon oxide layer. According to other embodiments, the gate dielectric 422 may be deposited silicon oxide, for example, a silicon dioxide, which may be nitrided afterwards or another oxide or silicon oxide of elements of the third or fourth group including oxides of rare earth, for example $Al_2O_3$, $HfO_2$, $HfSiO_2$, $CrSiO_2$, $DySiO_2$ or another high-k material.

Each word line structure 420 may comprise a first insulator structure 424 patterning an upper portion of the buried layer 401, a gate electrode 425a, 425b facing the floating body regions 410 at the gate dielectrics 422, and a second insulator structure 426 arranged between the main surface 403 and a top edge of each gate electrode 425a, 425b. Each gate electrode 425a, 425b may overlap with the first and/or the second source/drain regions 411, 412 or may be restricted to the floating body region 410 without overlapping the first or second source/drain regions 411, 412. Each gate electrode 425a, 425b may comprise or consist of a doped polysilicon, a metal or a metal compound having a suitable work function. Bit lines 417 extend along a direction intersecting the cross-sectional plane and may be arranged above the main surface 403 and in contact with the second source/drain regions 411 arranged along the bit line direction.

A fixed voltage may be permanently supplied to the buried layer 401. By applying a suitable write voltage to one of the word lines 425a, 425b charge may be injected in or removed from the floating body regions 410 in accordance to a voltage supplied to the bit lines 417. By applying a suitable read voltage to one of the word lines 425a, 425b a voltage or a current is caused in the bit lines 417, wherein the caused signal depends on the amount and/or type of charge stored in the respective floating body region 410.

Figure 4B:
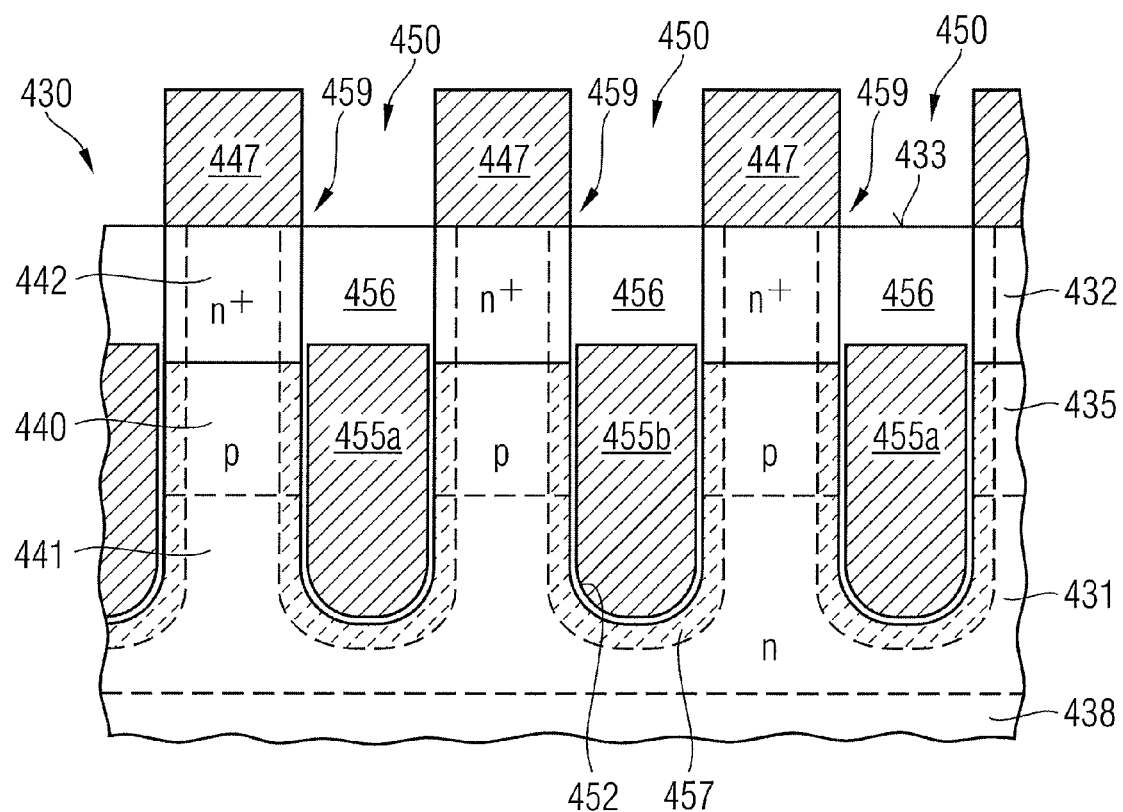
FIG. 4B is a schematic cross-sectional view of a portion of a memory cell array comprising vertical tri-gate single transistor floating body memory cells in accordance with another embodiment.

FIG. 4B refers to a cross-sectional view through a substrate 430 comprising vertical tri-gate floating body memory cells 459. The substrate 430 may be a preprocessed single crystalline silicon wafer or a SOI wafer that may comprise a n-type upper layer 432 adjoining a main surface 433 of the substrate 430, a buried n-type layer 431 and a p-type floating layer 435 sandwiched between the top layer 432 and the buried layer 431. Buried line-shaped insulator structures may be formed in the substrate 430 before and behind the cross-sectional plane and extend parallel thereto. The insulator structures may cut through the buried layer 431 to form segmented lines or may pattern an upper portion of the buried layer 431 leaving a bottom portion of the buried layer 431 unpatterned or stripe-shaped. Word line structures 450 are formed in the substrate 430, wherein the word line structures 450 partition the layers 431, 432, 435 between neighboring insulator structures to semiconductor pillars forming memory cells 459. Each memory cell 459 comprises first source/drain region 441 (first electrode) resulting from the buried layer 431, a second source/drain region 442 (second electrode) resulting from the top layer 432 and a floating body region 440 resulting from the floating layer 435. The first source/drain regions 441 of a plurality of memory cells 459 are connected to each other and a voltage source which is configured to supply a bias voltage to the first source/drain regions 441. The word line structures 450 comprise gate electrodes 455a, 455b, wherein a gate dielectric 452 is disposed between each gate electrode 455a, 455b and the neighboring memory cells 459. The gate electrodes 455a, 455b comprise further pocket portions 457 facing each other at the pillars. The pocket portions 457 may result from recessing the insulator structures isotropically to lamella-like portions of the insulator structures separating neighboring pillars, such that the word lines are wider in portions passing through the insulator structures than in portions between memory cells 459. As the gate electrode 455a, 455b wraps around the floating body region 440 on three sides similar to a tri-gate MOSFET, the capacitive coupling between the gate electrode 455a and the floating body region 440 may be improved. A top insulator 456 may be provided above the gate electrodes 455a, 455b to reduce capacitive coupling between the word lines and the second source/drain regions. Bit lines 447 running along a direction intersecting the cross-sectional plane are in contact with the second source/drain regions of memory cells 459 associated with the respective bit line 447.

Figure 5:
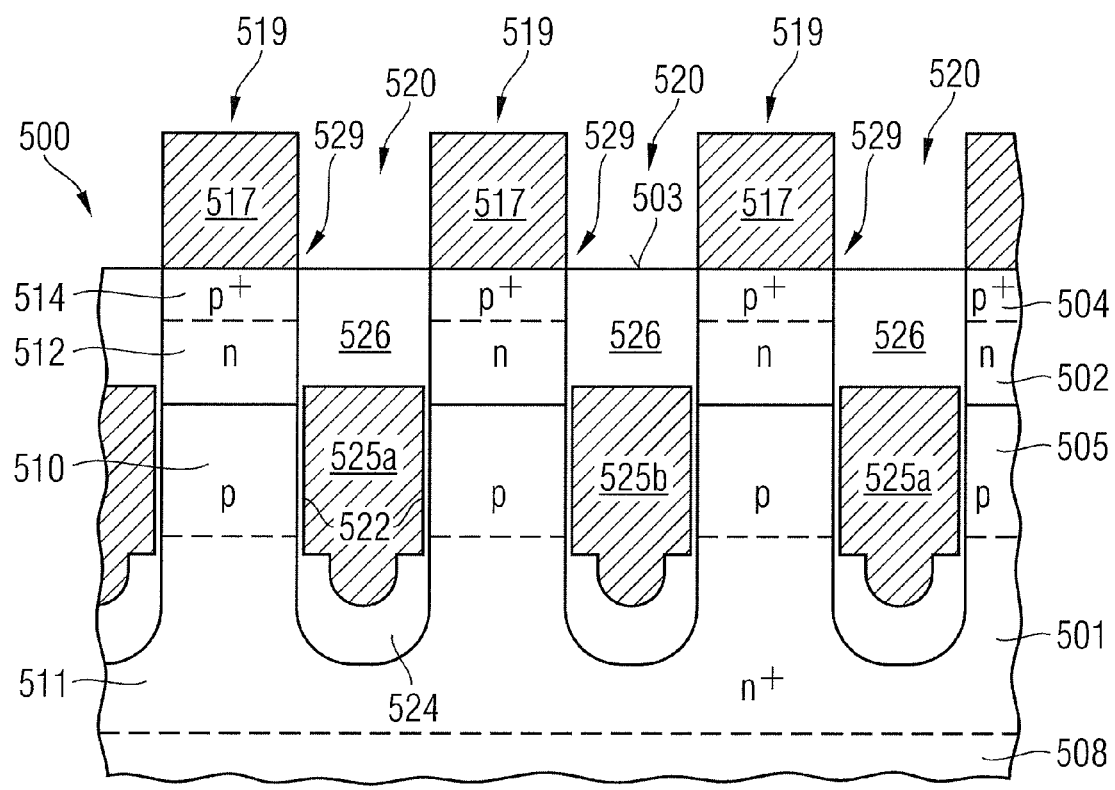
FIG. 5 is a schematic cross-sectional view of a portion of a memory cell array comprising vertical Thyristor-based floating body memory cells in accordance with further embodiment.

FIG. 5 refers to a cross-sectional view of a substrate 500 comprising vertical thyristor-based floating body memory cells 529. The cross-section may run along a segmented active area line A1, A2, A3 as illustrated in FIG. 1A. The substrate 500 may be a preprocessed single-crystalline silicon wafer or a silicon-on-insulator wafer and may comprise further doped and undoped portions. The substrate 500 may comprise a heavily doped top layer 504 of a first conductivity type adjoining a main surface 503 of the substrate 500, an intermediate layer 502 of a second conductivity type, which is the opposite of the first conductivity type adjoining the top layer 504 and a floating layer 505 of the first conductivity type sandwiched between the intermediate layer 502 and the buried layer 501, wherein the buried layer 501 is of the second conductivity type. According to the example as illustrated in FIG. 5 the first conductivity type is the p-type and the second conductivity type is the n-type. Word line structures 520 extend between neighboring cell rows 519 of memory cells 529 in a direction intersecting the cross-sectional plane and separate neighboring cell rows 519 of memory cells 529. Each single word line structure 520 is arranged between two neighboring cell rows 519 and each single cell row 519 is arranged between two neighboring word line structures 520 respectively. Insulator structures may separate neighboring memory cells 529 associated to the same cell row 519. The word line structures 520 as well as the insulator structures may be formed in trenches that are formed the substrate 500 starting from the main surface 503 and may have the same or different depths as described with regard to FIG. 4A.

According to the embodiment as illustrated in FIG. 5, the depth of the word line structure 520 may be selected such that the word line structures 520 cut through the floating layer 505 with or without patterning an upper portion of the buried layer 501, wherein a lower edge of the word line structures 520 is below the lower edge of the floating layer 505 and below or not below the upper edge of the buried layer 501. In accordance with further embodiments, the word lines structures 520 or the insulator structures may cut through the buried layer 501. The insulator structures and word line structures 520 define semiconductor pillars between them. Each pillar comprises an anode region 514 formed from the top layer 504, a cathode region 511 (first electrode) formed from the buried layer 501, a floating body region 510 formed from the floating body layer 505 and an avalanche region 512 formed from the intermediate layer 502. The thyristor formed between the anode region 514 and the cathode region 511 is switched on when the anode/cathode voltage is high enough to trigger or cause an avalanche breakdown at the pn-junction between the avalanche region 512 and the floating body region 510, wherein the trigger voltage depends on the voltage applied to the gate electrodes 525a, 525b.

Each word line structure 520 comprises two gate dielectrics 522 formed at interfaces between the word line structures 520 and adjoining memory cells 529. Each gate dielectric 522 extends essentially along that portion of the memory cell 529 that comprises the floating body region 510. In addition, each word line structure 520 may comprise a first insulator structure 524 which may be thicker than the gate dielectric 522 to reduce a capacitive coupling between the gate electrodes 525a, 525b and the cathode region 511. A second insulator structure 526 may be provided between the main surface 503 and the top edge of each gate electrode 525a, 525b. Each gate electrode 525a, 525b may overlap the cathode region 511 and/or the avalanche region 512 and may comprise or consist of a doped polysilicon, a metal or a metal compound. Bit lines 517 may extend along a direction intersecting the cross-sectional plane and may be arranged above the main surface 503 and in contact with the associated anode region 514.

A fixed voltage may be permanently supplied to the joined cathode regions 511. By applying a suitable write voltage to one of the word lines 525a, 525b, charge may be injected in or removed from the floating body region 510 in accordance to a voltage supplied to the bit lines 517. By applying a suitable read voltage to one of the word line 525a, 525b, a voltage/or a current is induced or caused in the associated bit line 517. If a floating body region 510 is positively charged, a higher voltage and/or current may be caused in the associated bit line 517 than without charge trapped in the floating body region 510. A write voltage pulse applied to the gate electrodes 525a, 525b may have several phases of different amplitude in order to facilitate a selection mode of a memory cell 529 that does not depend on the data contents of the respective memory cell 529.

The features of the embodiments described with reference to FIGS. 4A, 4B and 5 may be combined with each other and with any of the layouts as described with regard to FIGS. 1A, 1B, 1C. According to further embodiments the described embodiments of memory cell arrays are realized as embedded RAM, for example, in a system-on-chip (SoC), a processor, an application specific integrated circuit (ASIC) or a mixed signal device comprising analogue signal processing circuits.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. An integrated circuit including a memory cell array comprising:
    a plurality of memory cells arranged in cell rows, wherein each memory cell comprises a floating semiconductor body and is configured to store charge in the floating semiconductor body;
    a plurality of word lines, running along a first direction, wherein each word line is configured to control memory cells assigned to a pair of cell rows; and
    a plurality of bit lines, running along a second direction, the second direction being perpendicular to the first direction, wherein each bit line is electrically connected to an individual memory cell of each of said pairs of cell rows, wherein the memory cells are further arranged along cell columns running along a third direction that is tilted with respect to the first and second directions.

2. The integrated circuit of claim 1, wherein the individual word lines are respectively arranged between two neighboring cell rows of memory cells.

3. The integrated circuit of claim 1, wherein each word line is arranged in a word line trench formed between neighboring cell rows in a main surface of a semiconductor substrate.

4. The integrated circuit of claim 1, wherein each memory cell further comprises:
    a first electrode region disposed between the floating semiconductor body of the memory cell and a bulk portion of a semiconductor substrate, in which the memory cells are formed.

5. The integrated circuit of claim 4, wherein the first electrode regions are connected to each other.

6. The integrated circuit of claim 4, wherein each memory cell further comprises:
    a second electrode region facing the first electrode region at an opposing side of the floating semiconductor body, wherein each second electrode region is electrically connected to one of the bit lines.

7. The integrated circuit of claim 6, wherein the first electrode region forms a first source/drain region and the second electrode region forms a second source/drain region of a floating body field effect transistor.

8. The integrated circuit of claim 7, wherein an upper edge of the word lines is formed below an upper edge of the second source/drain regions.

9. The integrated circuit of claim 4, wherein:
    the first electrode regions form a cathode region; and
    each memory cell further comprises:
        an avalanche region facing the cathode electrode region at an opposing side of the floating semiconductor body; and
        an anode region facing the floating semiconductor body at an opposing side of the avalanche region, wherein each anode electrode region is electrically connected to one of the bit lines and the anode and the cathode electrodes form terminals of a floating body thyristor.

10. The integrated circuit of claim 1, further comprising:
    a plurality of insulator structures, wherein each insulator structure is disposed between neighboring memory cells and runs along the first direction.

11. The integrated circuit of claim 1, wherein the third direction intersects the first direction at an angle from 25 to 65 degrees.

12. The integrated circuit of claim 1, further comprising:
    a first word line driver circuit configured to supply a write signal to a first group of word lines; and
    a second word line driver circuit configured to supply a read signal to a second group of word lines, the read signal differing from the write signal;
    wherein word lines of the first and second group are arranged in alternating order.

13. The integrated circuit of claim 1, further comprising:
    a multiple voltage word line driver circuit configured to supply a write signal and a read signal to a first group of word lines; and
    a backgate driver circuit configured to supply a constant voltage to a second group of word lines;
    wherein word lines of the first and second group are arranged in alternating order.

14. The integrated circuit of claim 13, wherein
    the multiple voltage word line driver circuit comprises two portions facing each other at opposing sides of the memory cell array.

15. An integrated circuit including a memory cell array comprising:
    a plurality of memory cells arranged in cell rows, wherein each memory cell comprises a floating semiconductor body and is configured to store charge in the floating semiconductor body;
    a plurality of word lines, running along a first direction, each word line being configured to control the memory cells of a pair of cell rows and being arranged in a word line trench formed between neighboring cell rows in a main surface of a semiconductor substrate, wherein an upper edge of each word line is formed below the main surface; and
    a plurality of bit lines running along a second direction, the second direction being perpendicular to the first direction, wherein each bit line is electrically connected to one single memory cell of each of said pairs of cell rows, wherein the memory cells are further arranged along cell columns running along a third direction that is tilted with respect to the first and second directions.

16. The integrated circuit of claim 15, wherein the individual word lines are respectively arranged between each pair of neighboring cell rows.

17. An integrated circuit including:
    a plurality of memory cells arranged in cell rows, wherein each memory cell comprises a floating semiconductor body and is configured to store charge in the floating semiconductor body;
    a plurality of word lines, wherein each word line controls memory cells assigned to a pair of neighboring cell rows;
    a first word line driver circuit configured to supply a write voltage to a first group of word lines; and
    a second word line driver circuit configured to supply a read voltage to a second group of word lines, wherein word lines of the first and second groups are arranged in alternating order.

18. The integrated circuit of claim 17, further comprising:
    a plurality of bit lines, wherein each bit line is electrically connected to an individual memory cell of each pair of cell rows.

* * * * *